United States Patent
Sane et al.

(10) Patent No.: US 10,531,575 B2
(45) Date of Patent: Jan. 7, 2020

(54) SYSTEMS AND METHODS FOR REPLACEABLE BAIL GRID ARRAY (BGA) PACKAGES ON BOARD SUBSTRATES

(71) Applicant: INTEL CORPORATION, Santa Clara, CA (US)

(72) Inventors: Sandeep Sane, Chandler, AZ (US); Timothy Swettlen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/072,367

(22) PCT Filed: Apr. 1, 2016

(86) PCT No.: PCT/US2016/025656
§ 371 (c)(1),
(2) Date: Jul. 24, 2018

(87) PCT Pub. No.: WO2017/171857
PCT Pub. Date: Oct. 5, 2017

(65) Prior Publication Data
US 2019/0037708 A1     Jan. 31, 2019

(51) Int. Cl.
*H05K 3/40* (2006.01)
*H05K 3/34* (2006.01)
*H01L 23/498* (2006.01)

(52) U.S. Cl.
CPC ......... *H05K 3/4015* (2013.01); *H05K 3/3436* (2013.01); *H01L 23/49816* (2013.01); *H05K 2201/0367* (2013.01); *H05K 2201/09509* (2013.01); *H05K 2201/10734* (2013.01)

(58) Field of Classification Search
CPC combination set(s) only.
See application file for complete search history.

(56) References Cited

U.S. PATENT DOCUMENTS

| | | | |
|---|---|---|---|
| 6,046,909 A * | 4/2000 | Joy | H05K 1/112 257/773 |
| 2007/0090855 A1* | 4/2007 | Wark | G01R 1/0483 324/756.05 |
| 2007/0102816 A1* | 5/2007 | Kim | H01L 23/49816 257/737 |

(Continued)

FOREIGN PATENT DOCUMENTS

WO     93-04375 A1    3/1993

OTHER PUBLICATIONS

International Search Report issued in PCT/US2016/025656, dated Nov. 21, 2016, 3 pages.

*Primary Examiner* — Mamadou L Diallo
(74) *Attorney, Agent, or Firm* — Eversheds Sutherland (US) LLP

(57) ABSTRACT

The systems and methods described herein are directed to using a plurality of interface elements (e.g., sockets) and/or stud-bump elements embedded into board substrates (e.g., a motherboard) to enable the interchange of variable configuration components (e.g., electronic components, chips, and the like) that are mounted on package substrates having ball grid arrays (BGAs). In some aspects, this interchange can be accomplished while leaving the pre-existing board substrate design and various peripheral system components of the board substrate unchanged.

20 Claims, 4 Drawing Sheets

(56) References Cited

U.S. PATENT DOCUMENTS

| | | | |
|---|---|---|---|
| 2007/0269930 A1* | 11/2007 | Gupta | H01L 21/563 438/108 |
| 2009/0186452 A1 | 7/2009 | Joshi et al. | |
| 2011/0074026 A1* | 3/2011 | Shim | H01L 21/4846 257/737 |
| 2011/0285606 A1* | 11/2011 | De Graauw | H01L 23/49816 343/904 |
| 2012/0161312 A1* | 6/2012 | Hossain | H01L 23/49816 257/737 |
| 2012/0211887 A1 | 8/2012 | Pendse | |
| 2015/0008577 A1* | 1/2015 | Lee | H01L 21/4846 257/737 |
| 2015/0049443 A1* | 2/2015 | Meyer-Berg | H01L 23/49833 361/749 |
| 2015/0318236 A1* | 11/2015 | Zhang | H01L 24/16 257/773 |
| 2016/0035659 A1* | 2/2016 | Nah | H01L 21/0334 257/668 |
| 2018/0177059 A1* | 6/2018 | Hattori | H01G 4/33 |

\* cited by examiner

SYSTEMS AND METHODS FOR REPLACEABLE BAIL GRID ARRAY (BGA) PACKAGES ON BOARD SUBSTRATES

CROSS-REFERENCE TO RELATED APPLICATION(S)

This application is a U.S. National Stage Application under 35 U.S.C. 371 and claims the priority benefit of International Application No. PCT/US16/25656, filed Apr. 1, 2016, which is incorporated herein by reference as if set forth in full.

TECHNICAL FIELD

This disclosure generally relates to semiconductor packages, and more particularly to systems and methods for attaching semiconductor packages to board substrates.

BACKGROUND

Integrated circuit(s) and other electronic devices may be packaged on a semiconductor package. The semiconductor package may be integrated onto an electronic system, such as a consumer electronic system. Semiconductor packages may be electrically coupled to a board using ball grid array (BGA) interconnects. BGA interconnects may be difficult to rework and/or replace with other products in the same socket.

BRIEF DESCRIPTION OF THE FIGURES

Reference will now be made to the accompanying drawings, which are not necessarily drawn to scale, and wherein.

DETAILED DESCRIPTION OF EMBODIMENTS OF THE DISCLOSURE

Figure 1:
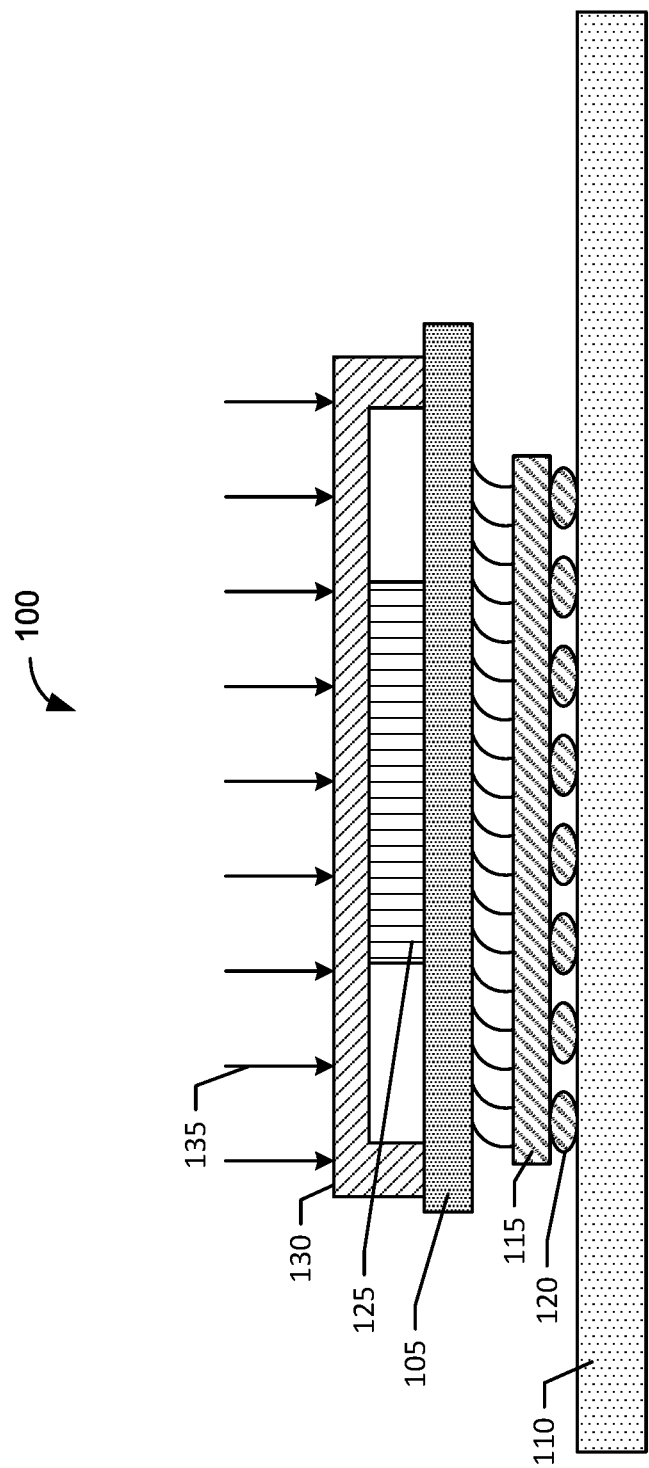
FIG. 1 shows a diagram of a package substrate mounted on a board substrate with Ball Grid Array (BGA) and sockets using existing process of records (PORs) in accordance with conventional systems and methods for package substrate to board substrate connection.

Embodiments of the disclosure are described more fully hereinafter with reference to the accompanying drawings in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, materials, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions are for the clarity of presentation and may be exaggerated in the drawings. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (e.g., surface of a substrate), regardless of its orientation. The term "vertical" as used herein may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein includes deposition of material or photoresist, patterning, exposure, development, etching, cleaning, ablating, polishing, and/or the removal of the material or photoresist as required in forming a described structure.

In example embodiments, the semiconductor package structures may include a package substrate. In some cases, the package substrate may be an organic structure. In other cases, the package substrate may be inorganic (e.g., ceramic, glass, etc.). The package substrate may, in example embodiments, include a core layer with one or more interconnect layers built up on one or both sides of the core layer. One or more electronic components, including at least one integrated circuit die, may be electrically and mechanically coupled to the package substrate via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like. Semiconductor package-to-board level interconnects may be provided on one or both sides of the package substrate. In example embodiments, the semiconductor package-to-board level interconnects may be ball grid array (BGA) connections.

The semiconductor package may have a ground layer provided on the surface of the semiconductor package, such as on the top interconnect layer of the semiconductor package. In other cases, the semiconductor package may have a ground plane formed in a layer that is within the package substrate, such as on the package core and/or a build-up layer that is not on the surface of the package substrate. Molding, to mechanically protect the electronic components, may be formed on top of the one or more electronic components on a surface of the semiconductor package. Semiconductor package-to-board level interconnects may be provided on one or both sides of the package substrate.

The process, as depicted herein, may be implemented to concurrently or nearly concurrently fabricate a plurality of board substrates and/or package substrates. The semiconductor package may be fabricated with any variety of processes or sequences thereof. Although a particular fabrication sequence is shown here with fabrication of various structures and/or features, both final and/or temporary, any variations for fabricating similar features may be implemented in accordance with example embodiments of the disclosure. Further still, there may be additional and/or fewer features than the features disclosed herein for the fabrication of the board substrates and/or package substrates, in accordance with example embodiments of the disclosure. Although the cross-sections as depicted here show a particular number of board substrates and/or package substrates fabricated concurrently on a package substrate panel, it will be appreciated that there may be any number of board substrates and/or package substrates that are fabricated concurrently or nearly concurrently on a particular board substrate and/or package substrate panels. Additionally, although an example embodiment of the sequence of processes for fabricating board substrates and/or package substrates is depicted, it will be appreciated that there may be any number of board substrates and/or package substrates that may be processed concurrently and/or near concurrently through any of the processes depicted herein. For example, some processes may be batch processes where a particular unit (e.g., board substrate panel) may be processed along with another of that unit. In other cases, unit processes may be performed in a sequential manner on work-in-progress (WIP).

The systems and methods described herein may be directed to using a plurality of interface elements (e.g., sockets) and/or stud-bump elements embedded into board substrates (e.g., a motherboard) to enable the interchange of variable configuration components (e.g., electronic components, chips, and the like) that are mounted on package substrates having ball grid arrays (BGAs). In some aspects, this interchange can be accomplished while leaving the pre-existing board substrate design and various peripheral system components of the board substrate unchanged.

In example embodiments, the disclosed sockets and stud-bump elements can be in providing original equipment manufacturers (OEMs) with the flexibility to adjust manufacturer's packages and product stock keeping units (SKUs) based on market fluctuations and demands. Such adjustability may not be available using conventional approaches, because OEMs may use BGA packages that are soldered down on the board substrate assembled at original design manufacturers (ODMs). Thus OEMs may not have the ability to respond to rapidly changing market demands.

In example embodiments, the disclosed systems and methods can be that the package substrate can be mechanically clamped to the board substrate by applying enabling loads on the substrate package and/or the board package, or various components on the substrate package and/or the board package. Such clamping can substitute for heating and reflowing the BGA packages on board substrates as done with conventional methods. Moreover, the package substrate may need to be flattened with respect to the board substrate to ensure contact across BGAs on a package substrate and the board substrate comprising interface elements (e.g., sockets) and/or stud-bump elements. In one aspect, the enabling loads necessary to flatten the packages can be less than the enabling loads used in conventional systems and methods. One advantage for the reduction in the enabling loads can be that current and/or future boards and packages may comprise thin and conformal substrates and hence be more compliant than thicker boards and packages. For instance, a substrate core can be less than approximately 400 micrometers (um) thick. As a result, smaller enabling loads can be required to flatten such packages.

According to example embodiments of the disclosure, reworkable BGA socket connections may be provided for connecting two substrates (e.g., package substrate to a PCB). BGA sockets may be formed on one of the substrates (e.g., the PCB) corresponding to BGA interconnects on the other of the substrates. The sockets may be a plurality of depressions in the socket-side substrate with each of the sockets surface treated to increase the coefficient of static friction that the socket may have to a deformed BGA ball. Next, the BGA-side substrate may be aligned to the socket-side substrate and placed. After alignment, a force may be applied to the surface of the BGA-side substrate, such that the force pushes each of the BGA balls into their corresponding sockets and deforms the BGA balls within the socket to mechanically hold the two substrates together, and further provide electrical coupling between each of the BGA balls and its corresponding socket. In some example embodiments, protruding features may be fabricated within some or all of the sockets. The protruding features may effectively increase the surface area of deformation and contact of the BGA ball within each of the sockets. As a result, the protruding features may increase the relative level of holding force between the two substrates after assembly. In example embodiments, the protruding feature may be fabricated by forming a wire bond ball attached substantially at a base of a socket and a relatively short wire protrusion therefrom. Surface finishes within the socket may be used to enhance the reliability of the socket and/or connections thereto.

FIG. 1 shows a diagram of a package substrate mounted on a board substrate with BGAs and sockets using existing process of records (PORs) in accordance with conventional systems and methods for package substrate to board substrate connection. In particular, FIG. 1 shows a board substrate 110 (e.g., a motherboard), upon which a package substrate 105 comprising a variable configuration component (e.g., electronic component, chip, SKU, and the like) 125, a BGA 120, and a socket 115 can be assembled. The socket 115 provides a way for different types of package substrates 105 to be mounted on the socket 115 and thereby connect to a board substrate 110, without the need for reconfiguring (e.g., reworking and reflowing) the BGA 120 for the different package substrates 105. Hence the socket 115 can allow for the package substrate 105 to be attached to the board substrate 110 using an enabling load 135, instead of a more complex reflow process for the BGA 120. As such, the package substrate 105 can, in some aspects, be assembled at an ODM, as opposed, for example, to an OEM.

Figure 2:
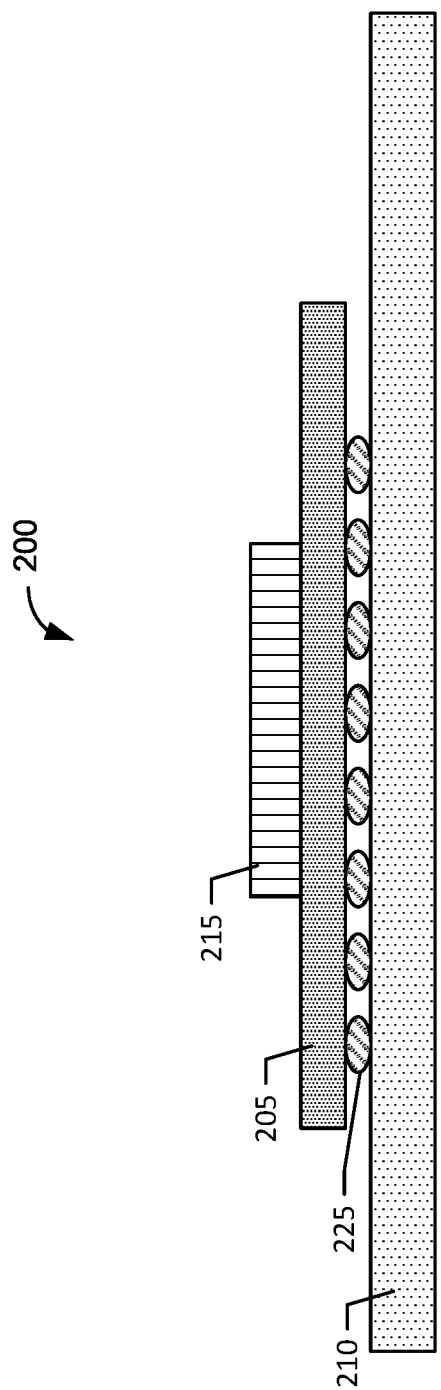
FIG. 2 shows a diagram of an exemplary original design manufacturer (ODM)-assembled board substrate having such BGA embodiments of the disclosure.

However, as mentioned, there are reasons for OEMs to use BGAs that are soldered down on the board substrate and are assembled at the ODMS to connect the board substrates and the package substrates, instead of having a socket 115 as in FIG. 1. FIG. 2 shows a diagram of an exemplary ODM-assembled board substrate having such a BGA. As shown in FIG. 2, a BGA 225, a package substrate 205 comprising a one (or more electronic components) 215 can be assembled on top of the board substrate 210. As mentioned, this can cause OEMs to project their product demands in advance for each variable configuration component 215, so that the ODM can assemble the board substrates accordingly.

Figure 3:
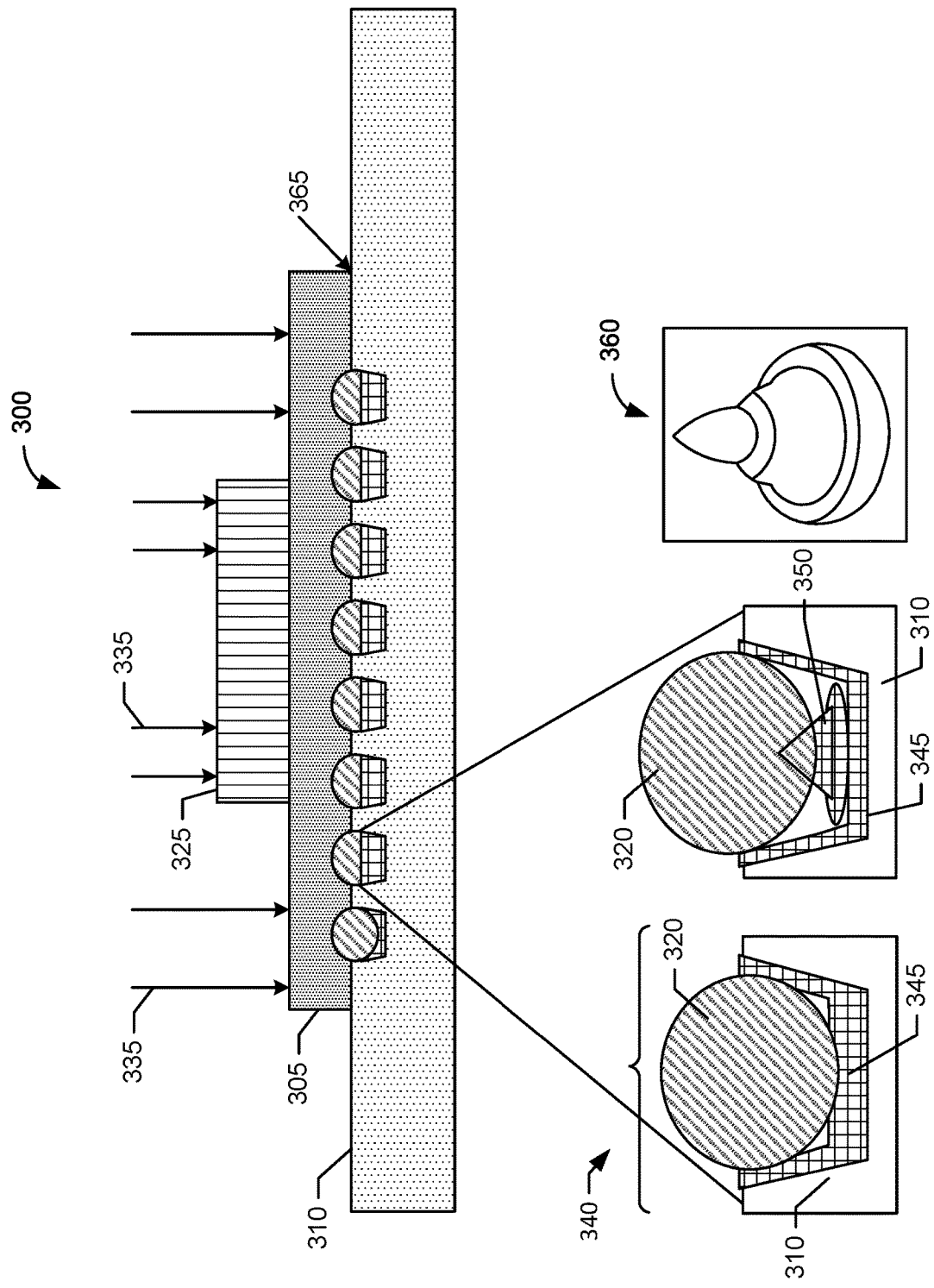
FIG. 3 shows a diagram of an exemplary board substrate comprising interface elements that take advantage of the design benefits of both FIGS. 1 and 2, in accordance with embodiments of the disclosure.

FIG. 3 shows a diagram of an exemplary board substrate comprising interface elements 340 that takes advantage of the design benefits of both FIGS. 1 and 2, in accordance with the disclosure. FIG. 3 shows an aspect of the disclosure wherein a plurality of interface elements 340 are added to the board substrate 310. In particular, the interface elements 340 can comprise a base structure (alternatively called a base element herein) 345 and, optionally, a stud bump element 350. In some embodiments, the base structure 345 can comprise a plated metallic structure. Additionally, it can serve as the contact surface for the BGA by itself (e.g., with an additional stud bump element 350 inside). As such, the base structures 345 can have a rough surface that can be fabricated as part of the plating process used to make the base structures 345. Such a matte and/or rough surface can improve the interfacial contact between the base element 345 and the BGA elements 320. Moreover, various stud bump elements 350 can be fabricated into the base structures 345 of the interface elements 340 and can serve to promote adhesion and electrical contact between the base elements 345 and the BGA elements 320 of the package substrate 305. In some aspects the stud bump elements 350 can comprise pointed conical structures 360, as shown in FIG. 3. In similar or alternative embodiments, the stud bump elements 350 can comprise a corrugated, toothed, saw-like structure, and the like, to further maintain the connection between the base elements 345 and the BGA elements 320. In accordance with the disclosure, an enabling load 335, can be applied to the variable configuration component 325 and/or package substrate 305 (and/or thermal masks associated with the package substrate 305 (not shown), but see, for example, thermal mask 103 of FIG. 1). This can cause the BGA elements 320 of the package substrate 305 to press into the interface elements 340 of the board substrate 310. As mentioned, the interface elements 340 can optionally include stud bumps 350 in the base structures 345 of the interface elements on the board substrate, enhancing the connection between the package substrate and the board substrate 310.

In various aspects, the package substrate 305 can comprise multiple electronic devices 325, e.g., chips and/or chip sets (not shown). For example, the electronic devices 325 can be stacked or arranged in a variety of different positions to optimize package substrate 305 real estate.

Another advantage of using the disclosed systems and methods, and lower z-height features. The z-height feature can be achieved because of the interface elements 340 and stud-bump elements 350 embedded into the board substrate 310 can provide the connection rather than protruding sockets (e.g. socket 115 of FIG. 1) of conventional approaches. Furthermore, in one embodiment, the package substrate 305 (alternatively board substrate 310) can have one or more apertures and/or openings (not shown) that can allow for various parts (chipsets, capacitors, resistors, and the like, not shown) on the board substrate 310 (alternatively package substrate 305) to fit through the apertures such that parts pass through the apertures and/or openings without colliding with the board substrate 310. This can promote a relatively flush interface to exist between package substrate 305 and the board substrate 310.

Moreover, the package substrate 305 may have one or more electronic components or devices 325 disposed thereon. Although for illustrative purposes, only one electronic component 325 per package substrate 305 is depicted in FIGS. 1-3, it will be appreciated that there may be any suitable number of electronic components 325 disposed in each package substrate 305, in accordance with example embodiments of the disclosure. The electronic components 325 may be any suitable electronic components including, but not limited to, integrated circuits, surface mount devices, active devices, passive devices, diodes, transistors, connectors, resistors, inductors, capacitors, microelectromechanical systems (MEMSs), combinations thereof, or the like. The electronic components 325 may be electrically and mechanically coupled to the semiconductor package substrate 305 via any suitable mechanism, such as metal pillars (e.g., copper pillars), flip chip bumps, solder bumps, any type of low-lead or lead-free solder bumps, tin-copper bumps, wire bonds, wedge bonds, controlled collapse chip connects (C4), anisotropic conductive film (ACF), nonconductive film (NCF), combinations thereof, or the like.

As mentioned, in one embodiment, the enabling load 335 can be applied to a thermal mask 130. The thermal mask 130 may be necessary for high power parts. In such a case the load 335 can be applied to the thermal mask 130; if there is no thermal mask 130, then the enabling load 335 can be applied to the variable configuration component 325.

The enabling load 335 can comprise a force applied in a pre-determined direction, e.g., substantially perpendicular direction to the plane of the variable configuration component 325 and/or thermal mask 130. For example, a pick and place system (not shown) can be used to apply the enabling load of a pre-determined magnitude and direction to the variable configuration component 325 and/or thermal mask 130, while the board substrate 310 is placed on a hard surface to provide an opposing force.

In various embodiments, the base element 345 can comprise a metallic, semi-metallic, or intermetallic material. In various embodiments, the base element 345 can comprise a metallic material. Non-limiting examples include gold, copper, silver, aluminum, zinc, tin, platinum, and any of the like. Metallic materials may also be any alloys of such materials.

In various embodiments, the base element 345 can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the base element 345 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In various aspects the base element 345 can be fabricated using a plating process. Moreover, the base structure 345 can additionally comprise a surface finish. This can enable the base element to have multiple contacts and have enough roughness to penetrate any self-aligned contact (SAC) oxides. In various embodiments, the finish can comprise an electroless nickel immersion gold (ENIG) or electroless nickel electroless palladium immersion gold (ENIPIG).

The stud bump element 350 can comprise a metallic, semi-metallic, or intermetallic material. In various embodiments, the stud bump element 350 can comprise a metallic, semi-metallic, or intermetallic material. In various embodiments, the base element 345 can comprise a metallic material. Non-limiting examples include gold, copper, silver, aluminum, zinc, tin, platinum, and any of the like. Metallic materials may also be any alloys of such materials.

In various embodiments, the stud bump element 350 can comprise a semi-metallic material. Non-limiting examples include arsenic, antimony, bismuth, α-tin (gray tin) and graphite, and mercury telluride (HgTe). Semi-metallic materials may also be any mixtures of such materials.

In various embodiments, the stud bump element 350 can comprise an intermetallic material. Non-limiting examples include gold and aluminum intermetallics, copper and tin intermetallics, tin and nickel intermetallics, tin and silver intermetallics, tin and zinc intermetallics, and any of the like. Intermetallic materials may also be any alloys of such materials.

In various aspects, the stud bump element 350 can be fabricated using a stud bump bonding process, for example, using a stud bump bonder. The stud bump bonding process can, in various embodiments, comprise a ball being formed using a standard ball bumping process. After the ball is bonded to the base element 345, wire clamps can be closed and the bondhead can move to tear the wire. If the move is purely vertical, a "tail" can be left on top of the bump, providing the stud element. In one embodiment, the size of the stud bump element 350 can be dependent on the wire size and type, as well as the bonding tool and the bonding process. It can be necessary to have wires formulated to have a better control the heat-affected zone (HAZ) to provide a repeatable bump height and shape. In another embodiment, the stud bump element can comprise gold wire, although copper can alternatively be used. Gold stud bump elements may offer superior reliability compared to solder bump elements, because they are not subject to solder fatigue.

In various embodiments, the package substrate 305 and/or the board substrate 310 may be of any suitable size and/or shape. For example, the package substrate 305 and/or the board substrate 310, in example embodiments, may be a rectangular panel. In example embodiments, the package substrate 305 and/or the board substrate 310 may be fabricated of any suitable material, including polymer material, ceramic material, plastics, composite materials, glass, epoxy laminates of fiberglass sheets, FR-4 materials, FR-5 materials, combinations thereof, or the like. The substrates may have a core layer and any number of interconnect build-up layers on either side of a core layer. The core and/or the interconnect build-up layers may be any variety of the aforementioned materials and, in some example embodiments, may not be constructed of the same material types. It will be appreciated that the build-up layers may be fabricated in any suitable fashion. For example a first layer of build-up interconnect may include providing a package substrate core, with or without through holes formed therein. Electric laminate material may be laminated on the semiconductor substrate core material. Vias and/or trenches may be patterned in the build-up layer using any suitable mechanism, including photolithography, plasma etch, laser ablation, wet etch, combinations thereof, or the like. The vias and trenches may be defined by vertical and horizontal metal traces, respectively within the build-up layer. The vias and trenches may then be filled with metal, such as by electroless metal plating, electrolytic metal plating, physical vapor deposition, combinations thereof, or the like. Excess metal may be removed by any suitable mechanism, such as etch, clean, polish, and/or chemical mechanical polish (CMP), combinations thereof, or the like. Subsequent build-up layers (e.g., higher levels of build-up layers) on either side of the core may be formed by the same aforementioned processes.

The interface elements 340 (base elements 345 and/or stud bump elements 350) can comprise aluminum, silver, copper, and the like, and/or an alloy of aluminum, silver, copper, and the like. The base elements 345 can be plated, can be or deposited via sputtering, paste printing, squeegee, atomic layer deposition (ALD), or a variety of different physical vapor deposition (PVD) techniques. The interface elements 340 may be laminated on top of the board substrate 310 by any suitable process, including, for example, cold roll or hot roll. In example embodiments, the interface elements 340 may be hot pressed on top of the board substrate 310. Additionally, the base structure elements 345 and/or the stud bump elements 350 can be deposited via any of the above mentioned techniques (or others that are not explicitly named herein) and then picked and placed on the interface elements 340, or plated or laminated thereon, or positioned atop the interface elements 340 via any other technique.

In another aspect of the disclosure, three additional concerns are addressed: (1) achieving low contact resistance (CRES) between the BGA 320 and the interface elements 340; (2) the reworkability of the stud bump elements 350 after removing the package substrates 305 from the board substrate 310; and (3) potential alignment issues and damage to BGA 320 balls.

In terms of achieving low CRES between the BGA 320 and the interface elements 340, the shape and size of the stud bump elements 350 can vary; consequently, various marks on the BGA 320 balls may be observed. The amount of deformation may be process dependent; the more consistent the stud bumping process, the more equal and uniform the contact. For example, a low CRES can be achieved if a force of approximately 25 g/BGA ball is used as the enabling load. For some BGAs, approximately 25 kg (approximately 55 lbs) may need to be applied. Additionally, in conjunction with or in place of the stud bump elements 350, features can also be plated on the interface element 340 and/or the stud bump elements 350 that can allow for a relatively rough surface finish. Such a surface can allow for surface topology capable of lowering the CRES at the interface.

In terms of the reworkability of the stud bumps elements 350 after removing a package substrate 305, in order to replace a previously connected variable configuration component 325, the enabling load 335 may need to be removed along with the variable configuration component 325. The removal of the variable configuration component 325 can be achieved for example, by using a claw and/or wedge in a gap 365 between the board substrate 310 and the package substrate to pull the board substrate 310 and package substrate 305 apart. Alternatively, the package substrate 305 can be heated and a vacuum pick up device can be used on the package substrate 305 to remove it from the board substrate 310 which can be held down to a tertiary surface, similar to existing surface-mounted electronic components (SMD) rework processes. The base structures 340 and/or the stud-bump elements 350 may then need to be cleaned, for example, using an industry standard rework process. This can, for example, involve applying a standard flux and/or paste, and removing oxides on the various surfaces of the base structure 340 and stud-bump elements 350. A new variable configuration component 325 can then be placed on the board substrate 310 and the board substrate 310 and the variable configuration component 325 can be clamped back together according to the systems and methods described herein. In some aspects, if the stud bump elements 350 are designed to comprise suitable dimensions, shapes, surface-roughness, material, and the like for a given application, the need for cleaning or damaging stud bumps 350 may not be stringent.

Another concern involves potential alignment issues when clamping the substrate package 305 to the board package 310 and the possible damage to BGA 320 balls. Alignment may be a concern since the disclosed systems and methods may, in some embodiments, reduce the self-centering nature of package under BGA 320 reflow. However, several standard processes may be used to align the package substrate 305 more precisely over the array of stud-bump elements 350 in the board substrate 310. Another concern may involve damage to the BGA 320 balls, e.g. scrub marks and similar damage that can occur on the BGA 320 balls in the process of establishing electrical and mechanical contact. However, this may not necessarily appreciably impact the electrical performance of the connection between the BGA 320 and the interface elements 340.

Figure 4:
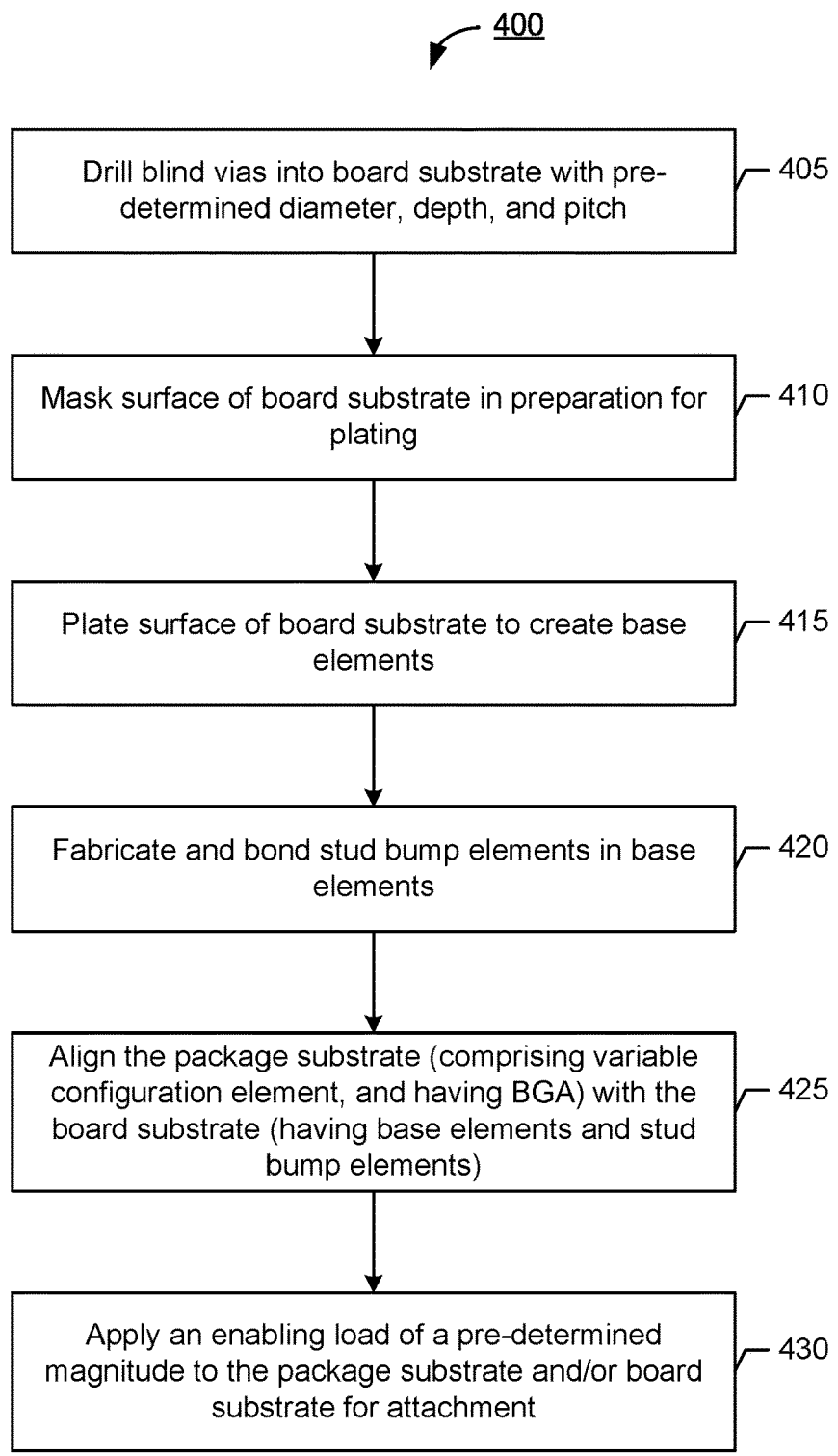
FIG. 4 shows a flow diagram in accordance with embodiments of the disclosure.

FIG. 4 shows a flow diagram of an example method 400 in accordance with the disclosure. At block 405 a plurality of vias can be drilled in the board substrate (e.g., the board substrate 310 of FIG. 3). For example, micro-via technology can allow for controllable depth and diameter ablating into the board substrate. For example, a laser drill can be used to drill approximately 200 um to approximately 300 um diameter via holes 1, 2, or 3 layers deep into the board substrate. The drilling depth may need to be discretized, e.g., to match a pre-impregnated (prepreg hereinout) thickness used to build the board substrate up. In some cases, these prepregs can be approximately 75 um to approximately 100 um thick. For example, for a variable configuration component (e.g., the variable configuration component of FIG. 3) comprising an approximately 0.4 mm pitch package, the ball diameter can be approximately 225 um. An approximately 250 um diameter via hole could be drilled 3 layers, e.g., approximately 225 um deep (assuming an approximately 75 prepreg) into the board substrate.

At block 410, the surface of the board substrate can be masked. The masking can comprise, for example, a dry-film lithography step to mask off areas where no copper (or seed metal layers) would deposit.

At block 415, metal can be plated into the vias. Moreover, the plating may be plated to have a surface finish capable of repeatable contacts that generate a low CRES. Step 415 can be performed by standard plating processes. The final surface finish may need to be selected such that it allows for multiple contacts and has enough roughness to penetrate any self-aligned contact (SAC) oxides. Electroless nickel immersion gold (ENIG) or electroless nickel electroless palladium immersion gold (ENIPIG) can be example finishes.

Once the board substrate is designed and manufactured, appropriate package substrates 430 (e.g., package substrate 305 of FIG. 3) using BGAs can be clamped to the PCB by simply positioning the package substrate on the board substrate and applying enabling loads.

It will be appreciated that the apparatus described herein may be any suitable type of microelectronics packaging and configurations thereof, including, for example, system in a package (SIP), system on a package (SOP), package on package (PoP), interposer package, 3D stacked package, etc. In fact, any suitable type of microelectronic components may be provided in the board substrates and/or package substrates as described herein. For example, microcontrollers, microprocessors, baseband processors, digital signal processors, memory dies, field gate arrays, memory dies, logic gate dies, passive component dies, MEMSs, surface mount devices, application specific integrated circuits, baseband processors, amplifiers, filters, combinations thereof, or the like, may be packaged in the board substrates and/or package substrates, as disclosed herein. The board substrates and/or package substrates, as disclosed herein, may be provided in any variety of electronic devices including, consumer, industrial, military, communications, infrastructural, and/or other electronic devices.

The semiconductor package, as described herein, may be used to house one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system, and the one or more processors and any chipsets included in an electronic device may be from a family of Intel® processors and chipsets, such as the Intel® Atom® processor(s) family or Intel-64 processors (e.g., Sandy Bridge®, Ivy Bridge®, Haswell®, Broadwell®, Skylake®, etc.).

Additionally or alternatively, the semiconductor package, as described herein, may be used to house one or more memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which board substrates and/or package substrates is provided may be a computing device. Such a computing device may house one or more boards on which board substrates and/or package substrates may be disposed. The board may include a number of components, including but not limited to a processor and/or at least one communication chip. The processor may be physically and electrically connected to a board through, for example, electrical connections of the board substrates and/or package substrates. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an Ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

In an embodiment, a board substrate, can include: a plurality of blind vias fabricated in the board substrate, the blind vias having a pre-determined diameter, depth, and pitch; and a plurality of interface elements fabricated in the blind vias, the interface elements can include base structures, the base structures comprising contact surfaces with a ball grid array (BGA). The interface element can include a stud bump element, wherein the stud bump element forms an additional contact surface with the BGA. The stud bump element can include a metallic, semi-metallic, or intermetallic material. The base structure is plated into the board structure. The base structure is deposited through one or more of a sputtering technique, a paste printing, squeegee, an atomic layer deposition (ALD) technique, or a physical vapor deposition (PVD) technique. The base structure can include a metallic, semi-metallic, or intermetallic material. The base structure can include a surface finish. The surface finish can include an electroless nickel immersion gold (ENIG) or electroless nickel electroless palladium immersion gold (ENIPIG).

In an embodiment, a method of fabricating a board substrate, can include: forming a plurality of blind vias in the board substrate, the blind vias having a pre-determined diameter, depth, and pitch; fabricating a plurality of interface elements in the blind vias, the interface elements can include base structures, the base structures comprising contact surfaces with a ball grid array (BGA); aligning a package substrate comprising the BGA with the board substrate; and applying an enabling load of a pre-determined magnitude to the package substrate or board substrate for attaching the package substrate to the board substrate using the plurality of interface elements. Forming a plurality of blind vias in the board substrate further can include drilling a plurality of blind vias in the board substrate. The method can include masking a portion of the surface of the board substrate, wherein the surface of the board that is covered excludes the plurality of blind vias. Fabricating the plurality of interface elements can include fabricating stud bump elements, wherein the stud bump elements form additional contact surfaces with the BGA. The method can include disposing the bump element using a pick and place system. The stud bump element can include comprise a metallic, semi-metallic, or intermetallic material. Fabricating the stud bump elements can include attaching a wire bond ball at a base of each of the plurality of blind vias. The base structure is plated into the board structure. The base structure is deposited through one or more of a sputtering technique, a paste printing, squeegee, an atomic layer deposition (ALD) technique, or a physical vapor deposition (PVD) technique. The method can include applying a surface finish to the base structure. The surface finish can include an electroless nickel immersion gold (ENIG) or electroless nickel electroless palladium immersion gold (ENIPIG). The method can include applying a removing force of a pre-determined magnitude to the package substrate or board substrate for removing the package substrate to the board substrate.

In an embodiment, an apparatus can include a board substrate, wherein the board substrate can include: a plurality of blind vias fabricated in the board substrate, the blind vias having a pre-determined diameter, depth, and pitch; and a plurality of interface elements fabricated in the blind vias, the interface elements can include base structures, the base structures can include contact surfaces with a ball grid array (BGA). The interface element can include a stud bump element, wherein the stud bump element forms an additional contact surface with the BGA. The stud bump element can include a metallic, semi-metallic, or intermetallic material. The base structure is plated into the board structure. The base structure is deposited through one or more of a sputtering technique, a paste printing, squeegee, an atomic layer deposition (ALD) technique, or a physical vapor deposition (PVD) technique. The base structure can include a metallic, semi-metallic, or intermetallic material. The base structure can include a surface finish. The surface finish can include an electroless nickel immersion gold (ENIG) or electroless nickel electroless palladium immersion gold (ENIPIG).

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices, or systems and performing any incorporated methods and processes. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed:

1. A board substrate, comprising:
a blind via fabricated in the board substrate, the blind via having a pre-determined diameter, depth, and, pitch; and
an interface element fabricated in the blind via, the interface element further comprising a base structure, the base structure comprising one or more conductive sidewalls and a conductive bottom portion, wherein a ball of a ball grid array (BGA) is in contact with at least the conductive bottom portion.

2. The board substrate of claim 1, wherein the conductive bottom portion further comprises a stud bump element.

3. The board substrate of claim 2, the stud bump element comprises a metallic, semi-metallic, or intermetallic material.

4. The board substrate of claim 1, wherein the base structure is plated into the board substrate.

5. The board substrate of claim 1, wherein the base structure is deposited through one or more of a sputtering technique, a paste printing, squeegee, an atomic layer deposition (ALD) technique, or a physical vapor deposition (PVD) technique.

6. The board substrate of claim 1, wherein the base structure comprises a metallic, semi-metallic, or intermetallic material.

7. The board substrate of claim 1, wherein the base structure comprises a surface finish.

8. The board substrate of claim 7, wherein the surface finish comprises an electroless nickel immersion gold (ENIG) or electroless nickel electroless palladium immersion gold (ENIPIG).

9. A method of fabricating a board substrate, comprising:
forming a blind via in the board substrate, the blind via having a pre-determined diameter, depth, and pitch;
fabricating an interface element in the blind via, the interface element further comprising a base structure, the base structure comprising one or more conductive sidewalls and a conductive bottom portion;
aligning a package substrate comprising the BGA with the board substrate; and
applying an enabling load of a pre-determined magnitude to the package substrate or board substrate for attaching the package substrate to the board substrate using the interface element, wherein, based on the enabling load, a ball of a ball grid array (BGA) is in contact with at least the conductive bottom portion.

10. The method of claim 9, wherein forming the blind via in the board substrate further comprises drilling a blind via in the board substrate.

11. The method of claim 9, wherein the method further comprises masking a portion of a surface of the board substrate, wherein the surface of the board that is covered excludes the blind via.

12. The method of claim 9, wherein fabricating the interface element further comprises fabricating a stud bump element on the base structure wherein the stud bump element forms an additional contact surface with the BGA.

13. The method of claim 12, wherein the method further comprises disposing the stud bump element using a pick and place system.

14. The method of claim 12, wherein the stud bump element comprises a metallic, semi-metallic, or intermetallic material.

15. The method of claim 12, wherein fabricating the stud bump element further comprises attaching a wire bond ball at a base of of the blind via.

16. The method of claim 9, wherein the base structure is plated into the board substrate.

17. The method of claim 9, wherein the base structure is deposited through one or more of a sputtering technique, a paste printing, squeegee, an atomic layer deposition (ALD) technique, or a physical vapor deposition (PVD) technique.

18. The method of claim 9, wherein the method further comprises applying a surface finish to the base structure.

19. The method of claim 18, wherein the surface finish comprises an electroless nickel immersion gold (ENIG) or electroless nickel electroless palladium immersion gold (ENIPIG).

20. The method of claim 9, wherein the method further comprises applying a removing force of a pre-determined magnitude to the package substrate or board substrate for removing the package substrate or the board substrate.

* * * * *